United States Patent
Zhang et al.

(10) Patent No.: US 10,680,155 B2
(45) Date of Patent: Jun. 9, 2020

(54) METHODS OF FABRICATION OF FLEXIBLE MICRO-THERMOELECTRIC GENERATORS

(71) Applicant: The Chinese University of Hong Kong, Shatin, N.T., Hong Kong (CN)

(72) Inventors: Wenhua Zhang, Hong Kong (CN); Dongyan Xu, Hong Kong (CN)

(73) Assignee: The Chinese University of Hong Kong, Shatin, N.T., Hong Kong SAR (CN)

( * ) Notice: Subject to any disclaimer, the term of this patent is extended or adjusted under 35 U.S.C. 154(b) by 94 days.

(21) Appl. No.: 15/596,611

(22) Filed: May 16, 2017

(65) Prior Publication Data

US 2017/0345989 A1 Nov. 30, 2017

Related U.S. Application Data

(60) Provisional application No. 62/340,685, filed on May 24, 2016.

(51) Int. Cl.
*H01L 21/00* (2006.01)
*H01L 35/32* (2006.01)
(Continued)

(52) U.S. Cl.
CPC ............ *H01L 35/325* (2013.01); *H01L 35/20* (2013.01); *H01L 35/30* (2013.01); *H01L 35/34* (2013.01)

(58) Field of Classification Search
CPC ....... H01L 35/325; H01L 35/20; H01L 35/30; H01L 35/12; H01L 35/34
See application file for complete search history.

(56) References Cited

U.S. PATENT DOCUMENTS

| 7,361,519 B2 * | 4/2008 | Yamazaki ........... H01L 27/1266 438/26 |
| 2016/0163949 A1 | 6/2016 | Stark et al. |
| 2016/0251992 A1 | 9/2016 | Kim et al. |

OTHER PUBLICATIONS

Cao et al., "Screen printed Flexible $Bi_2Te_3$—$Sb_2Te_3$ Based Thermoelectric Generator," Journal of Physics: Conference Series 476 (2013) 012031, 6 pages.

(Continued)

*Primary Examiner* — Richard A Booth
(74) *Attorney, Agent, or Firm* — Kilpatrick Townsend & Stockton LLP

(57) ABSTRACT

A cross-plane flexible micro-TEG with hundreds of pairs of thermoelectric pillars formed via electroplating, microfabrication, and substrate transferring processes is provided herein. Typically, fabrication is conducted on a Si substrate, which can be easily realized by commercial production line. The fabricated micro-TEG transferred to the flexible layer from the Si substrate. Fabrication methods provided herein allow fabrication of main TEG components including bottom interconnectors, thermoelectric pillars, and top interconnectors by electroplating. Such flexible micro-TEGs provide high output power density due to high density of thermoelectric pillars and very low internal resistance of electroplated components. The flexible micro-TEG can achieve a power per unit area of 4.5 mW $cm^{-2}$ at a temperature difference of ~50 K, which is comparable to performance of flexible TEGs developed by screen printing. The power per unit weight of flexible TEGs described herein is as high as 60 mW $g^{-1}$, which is advantageous for wearable applications.

22 Claims, 16 Drawing Sheets

(51) Int. Cl.
*H01L 35/34* (2006.01)
*H01L 35/30* (2006.01)
*H01L 35/20* (2006.01)

(56) References Cited

OTHER PUBLICATIONS

Carmo et al., "Thermoelectric Microconverer for Energy Harvesting Systems," IEEE Transactions on Industrial Electronics, Vo. 57, No. 3, Mar. 2010, 861-867.

Chen et al., "Dispenser-Printed Planar Thick-Film Thermoelectric Energy Generators," Journal of Micromechanics and Microengineering, Oct. 2011, 10 pages.

Kim et al., "Thermoelectric Power Generation Characteristics of a Thin-Film Device Consisting of Electrodeposited n-$Bi_2Te_3$ and p-$Sb_2Te_3$ Thin-Film Legs," Journal of Electronic materials, vol. 42, No. 9, 2013, 2752-2757.

Francioso et al., "Flexible Thermoelectric Generator for Ambient Assisted Living Wearable Biometric Sensors," Journal of Power Sources, 196 (2011) 3239-3243.

Glatz et al., "Optimization and Fabrication of Thick Flexible Polymer Based Micro Thermoelectric Generator," Sensors and Actuators A 132 (2006) 337-345.

Glatz et al., "Bi2Te3-Based Flexible Micro Thermoelectric Generator with Optimized Design," Journal of Microelectrical Systems, vol. 18, No. 3, Jun. 2009, 763-772.

Kim et al., "A Wearable Thermoelectric Generator Fabricated on a Glass Fabric," Energy Environ. Sci. 2014, 7, 1959-1695.

Kishi, et al., "Micro-Thermoelectric Modules and Their Application to Wristwatches as an Energy Source," 18th International Conference on Thermoelectrics (1999), 301-307.

Kraemer et al., "High-Performance Flat-Panel Solar Thermoelectric Generators with High Thermal Concentration," Nature Materials, vol. 10, Jul. 2011, 532-538.

Rostek et al., "A Review of Electroplating for V-VI Thermoelectric Films: From Synthesis to Device Integration," Journal of Materials Research 30, No. 17 (2015): 2518-2543.

Roth, et al., "Design and Characterization of Micro Thermoelectric Cross-Plane Generators With Electroplated $Bi_2Te_3$, $Sb_xTe_y$, and Reflow Soldering." Journal of Microelectromechanical Systems 23, No. 4 (2014): 961-971.

Snyder et al., "Thermoelectric Microdevice Fabricated by a MEMS-like Electrochemical Process," Nature Materials, vol. 2, Aug. 2003, 528-531.

Weber et al., "Coin-Size Coiled-up Polymer Foil Thermoelectric Power Generator for Wearable Electronics," Sensors and Actuators A 132 (2006), 325-330.

Zhou et al., "Enhancing the Thermoelectric Properties of the Electroplated Bi2Te3 Films by Tuning the Pulse Off-to-on Ratio," Electrochemica Acta (2015) 217-224.

* cited by examiner

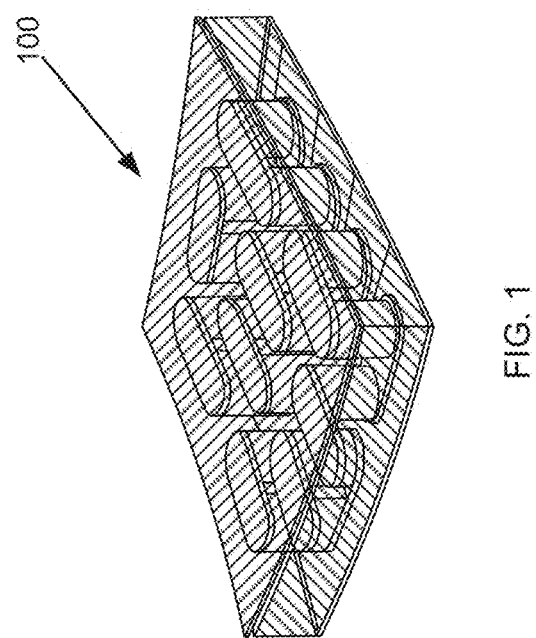

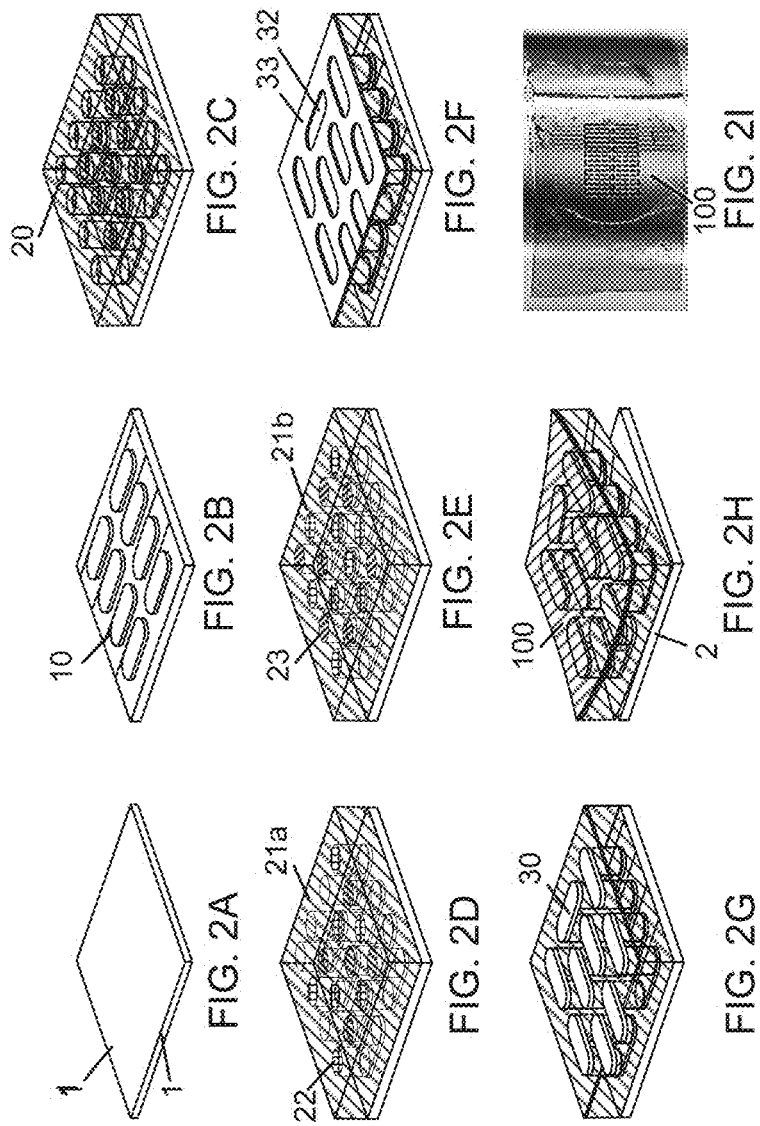

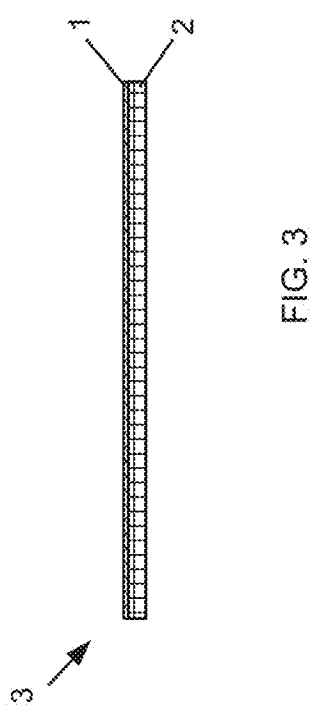

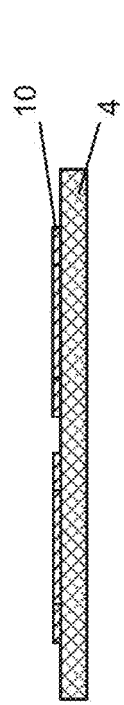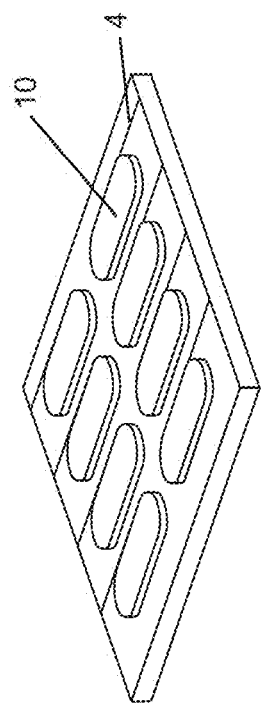

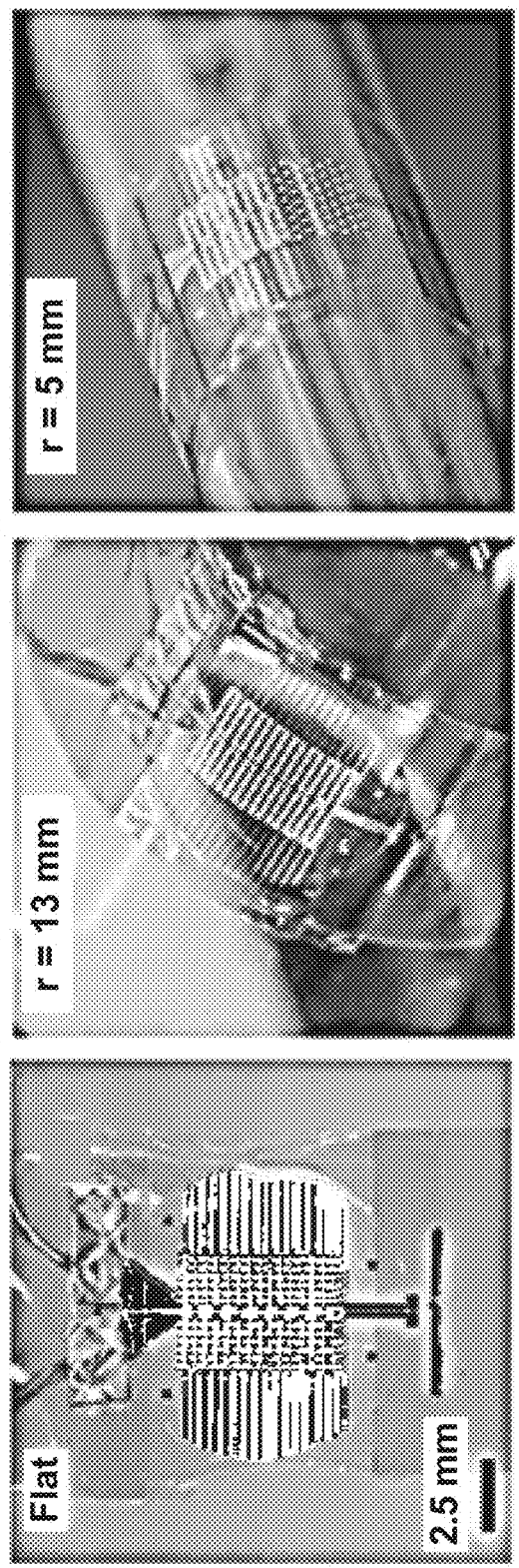

METHODS OF FABRICATION OF FLEXIBLE MICRO-THERMOELECTRIC GENERATORS

The present application is a Non-Provisional of and claims the benefit of U.S. Provisional Application No. 62/340,685 filed on May 24, 2016, the entire contents of which are incorporated herein by reference in their entirety.

BACKGROUND

The present invention relates to fabrication of flexible micro-thermoelectric generators. In particular, the invention provides improved methods of fabrication that produce flexible micro-thermoelectric generators having reduced internal resistance that imparts improved power density.

1. Field of the Invention

Thermoelectric generators (TEGs) are promising devices for waste heat recovery by virtue of their ability to directly convert heat to electricity. Despite relatively low energy conversion efficiency, TEGs have many advantages including high reliability, long lifetime, and environmental friendliness. Especially when compared to conventional heat engines, TEGs are compact, scalable, and can be easily driven by small temperature differences.

Potential applications of TEGs include thermal sensing, thermal management, and thermal energy harvesting to power wireless sensors and microelectronic devices such as wearable medical sensors and wristwatches. See for example J. P. Carmo, L. M. Goncalves, and J. H. Correia, "Thermoelectric microconverter for energy harvesting systems," *Ieee Transactions on Industrial Electronics*, vol. 57, pp. 861-867, Mar. 2010; and M. Kishi, H. Nemoto, T. Hamao, M. Yamamoto, S. Sudou, M. Mandai, and S. Yamamoto, "Micro thermoelectric modules and their application to wristwatches as an energy source," in *Thermoelectrics, 1999. Eighteenth International Conference on*, 1999, pp. 301-307, the entire contents of which are incorporated herein by reference. TEGs also provide an alternative approach to utilize solar energy beyond photovoltaics. See for example, D. Kraemer, B. Poudel, H.-P. Feng, J. C. Caylor, B. Yu, X. Yan, Y. Ma, X. Wang, D. Wang, A. Muto, K. McEnaney, M. Chiesa, Z. Ren, and G. Chen, "High-performance flat-panel solar thermoelectric generators with high thermal concentration," *Nat Mater*, vol. 10, pp. 532-538, 2011.

2. Background of the Invention

Flexible TEGs have even more potential applications than non-flexible TEGs because they can be applied to curved surfaces, which is essential for utilizing body heat to power wearable electronics. Without the protection of rigid substrates and covers, however, flexible TEGs need to have certain mechanical flexibility to bear repeated bending or stretching. Various researchers have developed TEGs on flexible polymer films by printing, evaporation, and sputtering techniques. Examples of TEGs developed by printing are described in Z. Cao, E. Koukharenko, M. J. Tudor, R. N. Torah, and S. P. Beeby, "Screen printed flexible $Bi_2Te_3$—$Sb_2Te_3$ based thermoelectric generator," *13th International Conference on Micro and Nanotechnology for Power Generation and Energy Conversion Applications (Powermems 2013)*, vol. 476, 2013, and in A. Chen, D. Madan, P. K. Wright, and J. W. Evans, "Dispenser-printed planar thick-film thermoelectric energy generators," *Journal of Micromechanics and Microengineering*, vol. 21, Oct. 2011. Examples of TEGs developed by evaporation and sputtering are described in L. Francioso, C. De Pascali, I. Farella, C. Martucci, P. Creti, P. Siciliano, and A. Perrone, "Flexible thermoelectric generator for ambient assisted living wearable biometric sensors," *Journal of Power Sources*, vol. 196, pp. 3239-3243, Mar. 15, 2011, and J. Weber, K. Potje-Kamloth, F. Haase, P. Detemple, F. Voeklein, and T. Doll, "Coin-size coiled-up polymer foil thermoelectric power generator for wearable electronics," *Sensors and Actuators a-Physical*, vol. 132, pp. 325-330, Nov. 8, 2006. Any and all publications referred to in the present application are incorporated herein by reference in their entirety for all purposes.

These flexible TEGs adopted $Bi_2Te_3$, $Sb_2Te_3$, or their alloys as thermoelectric materials and demonstrated high flexibility, high open-circuit voltage, but quite low power density typically from tens of $nW\ cm^{-2}$ to $\mu W\ cm^{-2}$ at temperature difference of 20° C. This drawback is mainly due to the large electrical resistance of printed/sputtered materials and large contact resistance at interfaces, which dramatically degrade the power output. Another drawback of these flexible TEGs is their in-plane device structure, since in-plane TEGs normally have worse performance than the cross-plane TEGs because of the low density of thermoelectric pairs and detrimental parasitic heat flow through the substrate, as discussed in W. Glatz, E. Schwyter, L. Durrer, and C. Hierold, "$Bi_2Te_3$-based flexible micro thermoelectric generator with optimized design," *J. Microelectromech. Syst.*, vol. 18, pp. 763-772, Jun. 2009. Various patents relate to the fabrication of flexible TEGs in in-plane structure, including U.S. Patent Publication Nos. 2016/0163949 and 2016/0251992, the entire contents of which are incorporated herein by reference for all purposes. Recently, Kim et al. (S. J. Kim, J. H. We, and B. J. Cho, "A wearable thermoelectric generator fabricated on a glass fabric," *Energy & Environmental Science*, vol. 7, pp. 1959-1965, Jun. 2014) described fabrication of a cross-plane flexible TEG on fabric by screen printing. This approach achieved a high output power density, up to 3.8 $mW\ cm^{-2}$ at $\Delta T=50\ K$, which is attributed to high-performance thermoelectric materials and novel fabrication processes.

Electroplating has been used to fabricate TEGs on non-flexible substrates. (See for example, Glatz, et al., pp. 763-772; R. Rostek, N. Stein, and C. Boulanger, "A review of electroplating for V-VI thermoelectric films: from synthesis to device integration," *Journal of Materials Research*, vol. 30, pp. 2518-2543, Sep. 14, 2015; G. J. Snyder, J. R. Lim, C. K. Huang, and J. P. Fleurial, "Thermoelectric microdevice fabricated by a MEMS-like electrochemical process," *Nature Materials* 2 (2003) 528., 2003; M. Y. Kim and T. S. Oh, "Thermoelectric power generation characteristics of a thin-film device consisting of electrodeposited n-$Bi_2Te_3$ and p-$Sb_2Te_3$ thin-film legs," *Journal of Electronic Materials*, vol. 42, pp. 2752-2757, Sep. 2013; and R. Roth, R. Rostek, K. Cobry, C. Kohler, M. Groh, and P. Woias, "Design and characterization of micro thermoelectric cross-plane generators with electroplated $Bi_2Te_3$, $Sb_xTe_y$, and reflow soldering," *J. Microelectromech. Syst.*, vol. 23, pp. 961-971, Aug. 2014.) In comparison with other techniques, electroplating has a number of advantages including efficient usage of raw materials, compatibility with microfabrication processes, and low contact resistance, as mentioned in A. Zhou, Q. Fu, W. Zhang, B. Yang, J. Li, P. Ziolkowski, E. Mueller, and D. Xu, "Enhancing the thermoelectric properties of the electroplated $Bi_2Te_3$ films by tuning the pulse off-to-on ratio," *Electrochimica Acta*, vol. 178, pp. 217-224, 2015. However, electroplating techniques are seldom adopted for use in fabrication of flexible TEGs since presumably a rigid substrate is needed to conduct the electroplating process.

Fabrication of a cross-plane flexible TEG by electroplating is described in W. Glatz, S. Muntwyler, and C. Hierold, "Optimization and fabrication of thick flexible polymer based micro thermoelectric generator," *Sensors and Actuators a-Physical*, vol. 132, pp. 337-345, Nov. 8, 2006. The fabrication process was first conducted on a rigid silicon (Si) substrate and included the deposition of thermoelectric materials (nickel (Ni) and copper (Cu)) and the formation of Cu bottom interconnectors on the substrate. Then, the device layer is released from the Si substrate by removing the sacrificial layer. The flexible TEG is completed by patterning the top interconnectors and bonding pads on the flipped side. Although this approach attempts fabrication of a flexible TEG by electroplating, the releasing and flipping processes as well as the fabrication process after flipping are complicated and are not compatible with massive commercial production.

Thus, there is a need for improved flexible TEGs fabrication methods that are more robust and commercially viable. There is further need for such methods to produce flexible TEGs having sufficiently high power density to be useful for a variety of applications.

BRIEF SUMMARY

The present invention relates to methods of fabricating flexible TEGs having improved power density. In particular, the invention pertains to methods of fabricating cross-plane flexible micro-TEGs via electroplating, microfabrication and substrate transferring processes.

In one aspect, methods of fabricating a flexible TEG can include: forming a flexible TEG supported on a rigid substrate by electroplating, at least in part, each of a plurality of bottom interconnectors, a plurality of p-type and n-type thermoelectric pillars, and a plurality of top interconnectors; and removing the flexible TEG from the rigid substrate. In various embodiments, the method further includes forming a flexible layer on the rigid substrate before forming the flexible TEG. Forming the flexible layer includes forming a polyimide layer on the rigid substrate. In various embodiments, removing the flexible TEG from the rigid substrate includes peeling the flexible layer from the rigid substrate while the flexible TEG remains supported by the flexible layer. Another flexible layer can be formed atop the flexible TEG before removing the flexible TEG from the rigid substrate.

According to one aspect of the invention, the methods of fabrication provide a cross-plane flexible micro-TEG with hundreds of pairs of an n-type material (e.g. $Bi_2Te_3$) and a p-type material (e.g. $Sb_2Te_3$) thermoelectric pillars via a bottom-up approach and substrate transferring process. The fabrication process of the micro-TEG, can include sputtering, photolithography, and electroplating, conducted on a semi-rigid or rigid substrate (e.g. Si substrate), such that the processes can be easily realized by commercial production line. Then, the completed micro-TEG is transferred to the flexible layer from the Si substrate. In one aspect, each of the main components of the TEG, which include the bottom interconnectors, both n-type and p-type thermoelectric pillars, and top interconnectors, is fabricated, at least in part, by electroplating. The micro-TEG we developed demonstrates a very low internal resistance due to low electrical resistance of the electroplated components. As a result, a high power density can be potentially achieved for our micro-TEG.

According to another aspect, the invention provides a bottom-up method for fabricating flexible micro-TEGs on a rigid substrate. Such methods can include: spin coating a flexible polymer layer on top of a rigid substrate; fabricating multiple conductive metal electrodes atop the polymer layer; and patterning an epoxy matrix with designed holes atop the conductive metal electrodes. A thermoelectric material, which can include a combination of various thermoelectric materials, are then deposited atop the metal electrodes, the thermoelectric material being confined by the designed holes defined within the epoxy matrix so as to form multiple thermoelectric pillars within the designed holes. The method can further include forming top interconnectors connecting the thermoelectric pillars electrically in series. Lastly, the method can include removing the flexible micro-TEG formed on the polymer layer from the rigid substrate. It is appreciated that various approaches can be used to form a flexible micro-TEG on a rigid substrate such that the flexible micro-TEG can be obtained by peeling the flexible micro-TEG from the rigid substrate.

BRIEF DESCRIPTION OF THE DRAWINGS

FIG. 1 shows a flexible micro-TEG in accordance with embodiments of the present invention;

FIGS. 2A-2I show a process schematic for fabrication of a flexible micro-TEG in accordance with some embodiments;

FIG. 3 depicts a flexible layer formed on a rigid substrate during a fabrication process in accordance with some embodiments;

FIGS. 4A and 4B show a side view and a perspective view, respectively, that depict formation of bottom interconnectors and contacting pads during a fabrication process in accordance with some embodiments;

FIGS. 13A-13C show a flexible TEG under different testing conditions, namely, a flat condition, bended along a curvature of 13 mm, and bended along a curvature of 5 mm, respectively, in accordance with some embodiments;

DETAILED DESCRIPTION

Figure 5A:
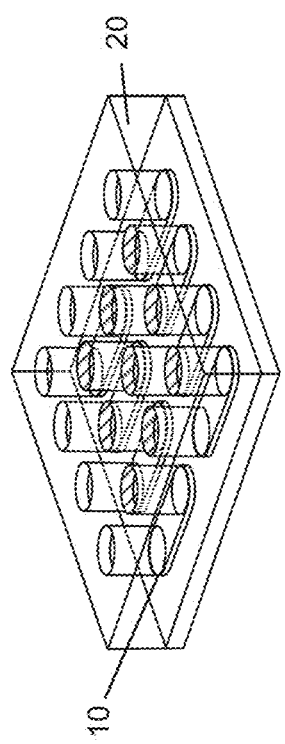
FIGS. 5A and 5B show a perspective view and a sectional view, respectively, that depict formation of a mold for deposition of thermoelectric materials in a fabrication process in accordance with some embodiments.

Embodiments of the present invention relate methods of fabricating flexible TEGs. In particular, the invention provides improved methods of fabrication that produce flexible micro-TEGs having reduced internal resistance that imparts improved power density.

FIG. 1 depicts a flexible micro-TEG 100 fabricated in accordance with the fabrication methods described herein. TEG 100 is without the rigid shell or substrate associated with conventional high output power density TEGs such that it is suitable for a variety of applications, including wearable devices. As shown, the device is fabricated as a cross-plane flexible micro-TEG with hundreds of pairs of thermoelectric pillars via electroplating, microfabrication, and substrate transferring processes provided herein. Typically, the fabrication process is conducted on a rigid substrate, such as a silicon substrate, which can be easily realized by commercial production line. The fabricated micro-TEG is then transferred to the flexible layer from the silicon substrate. In one aspect, the TEG is formed on a flexible layer supported on the rigid substrate. Typically, the flexible layer is coated directly on the rigid substrate, although in some embodiments, one or more intervening layers between the flexible layer and rigid substrate can be formed for various purposes. Advantageously, the methods provided herein allow that the main components of the TEG including bottom interconnectors, thermoelectric pillars, and top interconnectors are fabricated by electroplating. Such flexible micro-TEGs provide a high output power density due to high density of thermoelectric pillars and very low internal resistance of electroplated components.

FIG. 2 depicts a schematic of the fabrication process of a flexible micro-TEG, in accordance with some embodiments. Step (a) depicts a polyimide layer 1 spin-coated on the substrate 2 as the bottom packaging layer of the flexible micro-TEG 100. Step (b) depicts gold (Au) bottom interconnectors 10 and contacting pads patterned by sputtering and wet etching. In accordance with aspects of the invention, the bottom interconnector layer (e.g. Au layer) is then thickened by electroplating to reduce electrical resistance. Step (c) depicts a mold 20 (e.g. permanent SU-8 mold) with open holes patterned for the deposition of thermoelectric materials. Step (d) depicts a thin layer of photoresist 21a patterned to cover one group of holes and n-type $Bi_2Te_3$ 22 is deposited in the selectively opened holes by the pulse electroplating. Step (e) depicts deposited n-type $Bi_2Te_3$ covered by another layer of photoresist 21b and p-type $Sb_2Te_3$ 23 deposited in the remaining holes. Step (f) depicts the temporary mold 33 for depositing top interconnectors patterned on the lapped top surface. Step (g) depicts 3 μm thick Ni deposited by DC electroplating as top interconnectors 30 and the photoresist removed in acetone. Step (h) depicts the fabricated micro-TEG completely peeled off from the substrate including the polyimide packaging layer. Step (i) depicts the flexible micro-TEG attached onto a curved surface.

In accordance with certain aspects of the invention, the methods provide a fabrication process for high-power-density flexible micro-TEGs through electroplating, microfabrication, and substrate transferring processes. In various embodiments, fabrication starts with a 500 μm thick Si wafer with 300 nm thermal oxide layer on both sides. The wafer is first cleaved into 14 mm×14 mm square chips. Then, a flexible layer is formed on the substrate, for example, a thin layer of polyimide can be spin-coated on the substrate, as the bottom packaging layer of the flexible micro-TEG. FIG. 3 shows a flexible layer 1 (e.g. polyimide layer) spin-coated on a rigid substrate 2 (e.g. silicon substrate) as the bottom packaging layer.

In various embodiments, after formation of the flexible layer 1 on the rigid substrate 2, both sides of the composite substrate 3 are coated with a conductive layer, typically a 100 nm Au layer 4 by sputtering. During the process, the sidewalls of the substrate are also coated with the conductive layer (e.g. Au layer), which is important for forming electrodes for electroplating as discussed below. Next, bottom interconnectors 10 and thin connecting lines are patterned by wet etching using photoresist as a mask. It is worth noting that the Au layer on sidewalls and bottom surface of the substrate is protected by photoresist during the etching process. As a result, each bottom interconnector is connected with bottom surface of the substrate through a thin Au connecting line and the Au layer on the sidewalls, which works as the electrode for subsequent electroplating. In addition, two large Au pads (not shown) are also fabricated on the substrate during this step as electrodes of the micro-TEG to connect with external circuits or testing instrument. In order to reduce the total electrical resistance, one more step of photolithography is performed and bottom interconnectors and two large contacting pads are thickened by depositing a conductive layer (e.g. 1.5 μm Au layer) via DC electroplating, as shown in FIG. 4A.

FIGS. 4A-4B show formation of the bottom interconnectors 10 on the Au conducting layer 4 covered substrate 3, which includes the silicon substrate 2 and polyimide layer 1. In various embodiments, the bottom interconnectors and contacting pads are patterned by sputtering and wet etching. Typically, the bottom interconnectors 10 are formed of Au. The Au layer is thickened by electroplating so as to reduce electrical resistance.

Figure 5B:
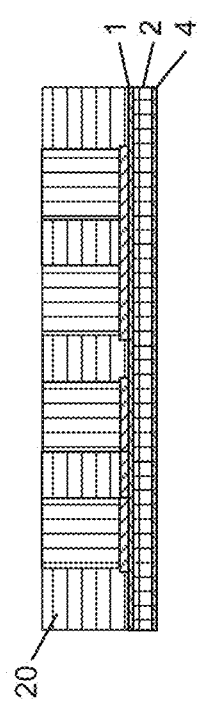

FIGS. 5A-5B depict a permanent SU-8 mold 20 with open holes patterned for the deposition of thermoelectric materials. A mold (e.g. a 10 μm thick SU-8 layer) is fabricated by photolithography with two open holes (e.g. 200-μm-diameter) patterned on each bottom interconnector (FIG. 5A). Two open holes serve as the mold for depositing n-type and p-type thermoelectric materials, respectively. In addition, small pinholes are also designed and fabricated in the SU-8 layer to prevent mechanical damage to thermoelectric pillars during the heating process due to the mismatch of thermal expansion coefficients between thermoelectric materials and SU-8. The SU-8 mold is cured at 150° C. for 15 min and turned into a permanent mold to enhance the mechanical strength of the micro-TEG.

Figure 6:
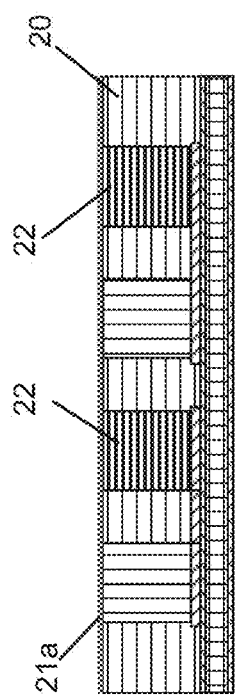
FIG. 6 depicts formation of n-type thermoelectric pillars in a TEG fabrication process in accordance with some embodiments.

FIG. 6 depicts a thin layer of photoresist 21a patterned to cover one group of holes in mold 20 and n-type material 22, such as $Bi_2Te_3$, deposited in the selectively opened holes by the pulse electroplating. One set of holes are covered by a thin layer of photoresist 21a and the whole chip is etched, such as by oxygen plasma at 50 W for 1 min, to remove organic residues on the exposed Au surface in the remaining open holes. An n-type material (e.g. $Bi_2Te_3$) is deposited in open holes by the pulse electroplating, as shown in FIG. 6.

In various embodiments, an aqueous electrolyte containing 30 mM $Bi^{3+}$, 40 mM $HTeO_2^+$, and 1.7 M $HNO_3$ is used for the deposition. A pulse-on potential ($E_{on}$) of 0 mV vs. Ag/AgCl (saturated KCl) and a pulse-off potential ($E_{off}$) of 200 mV can be fixed to achieve stoichiometric composition. Pulse-on time ($t_{on}$) and pulse-off time ($t_{off}$) are set as 0.1 s and 2.5 s, respectively, for obtaining dense and compact microstructure. In this example, all the n-type thermoelectric pillars are deposited concurrently under the same condition since all the bottom interconnectors are electrically connected with each other. The desired thickness can be achieved for the electroplated n-type material (e.g. $Bi_2Te_3$) by controlling the number of pulse cycles. After the deposition of n-type materials, the thin photoresist layer is removed in acetone.

Figure 7:
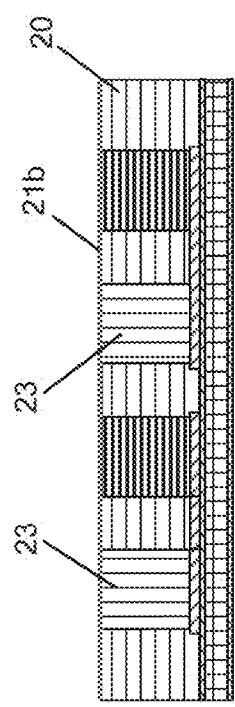
FIG. 7 depicts formation of p-type thermoelectric pillars in a TEG fabrication process in accordance with some embodiments.

Then, as shown in FIG. 7, another layer of photoresist 21b is used to cover the deposited n-type material 22 and a p-type material 23, such as $Sb_2Te_3$, is deposited in the remaining open holes by pulsed electroplating. In various embodiments, the aqueous electrolyte used for the deposition of $Sb_2Te_3$ contains 5.6 mM $[Sb_2(C_4H_4O_6)^2]^{2+}$, 10 mM $HTeO_2^+$, 1.0 M $HNO_3$, and 0.84 M tartaric acid. The deposition parameters are set as $E_{on}$=−250 mV, $E_{off}$=43 mV, $t_{on}$=0.1 s, and $t_{off}$=2.5 s.

Figure 8A:
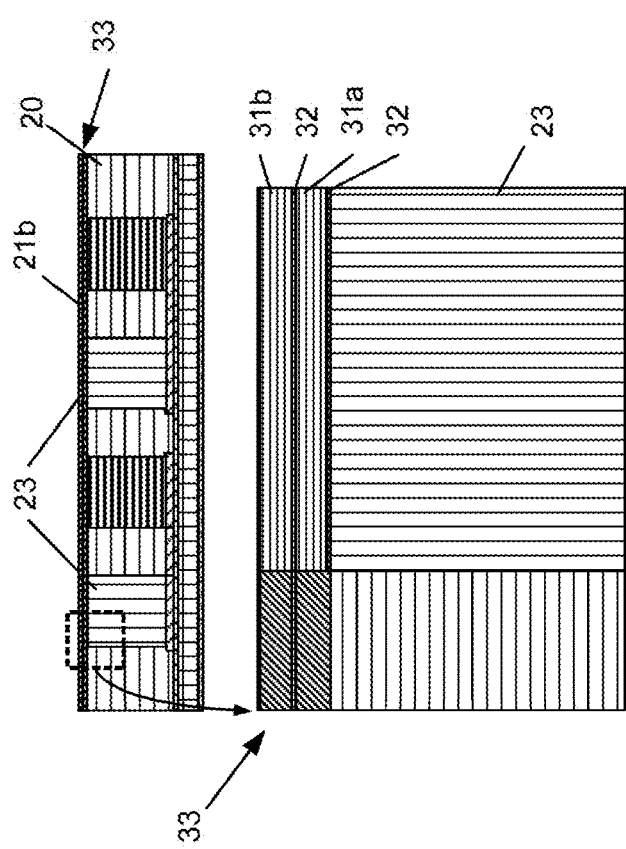
FIGS. 8A-8B and 9A-9C depict formation of top interconnectors in a TEG fabrication process in accordance with some embodiments.
Figure 8B:
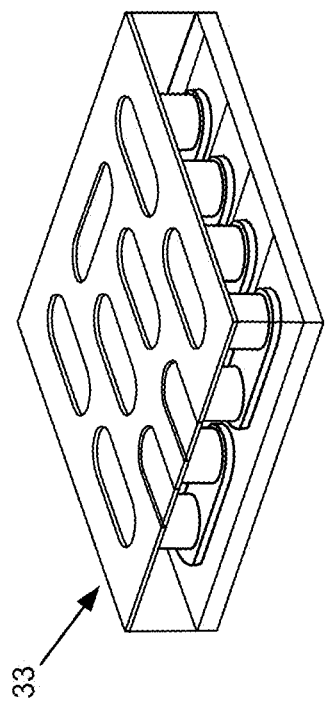

In various embodiments, during the pulsed electroplating, the n-type and p-type thermoelectric pillars can intentionally be made thicker than the SU-8 mold in which they are formed. A lapping process can be used to make the top surface even. Next, top interconnectors 30 are formed by electroplating on the lapped top surface. A thin photoresist layer 31a is first patterned with shaped holes for the deposition of top interconnectors 30. In various embodiments, a thin Au conducting layer 32 (e.g. about 60 nm) is sputtered on the entire top surface, serving as a seed layer for subsequent electroplating. A second photoresist layer 31b is then patterned, typically having the same pattern as the first layer. As shown in FIGS. 8A-8B, two photoresist layers 31a, 31b are well aligned with each other and together with Au conducting layer 32, serve as the temporary mold 33 for the deposition of top interconnectors. Top interconnectors 30 are formed on the lapped top surface by electroplating. In various embodiments, a low-stress Ni layer is deposited by DC electroplating. Next, the chip is soaked in acetone to remove the photoresist.

Figure 9A:
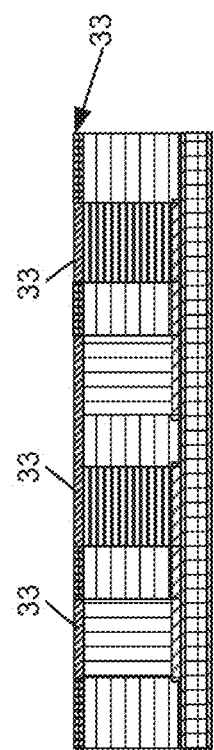
Figure 9B:
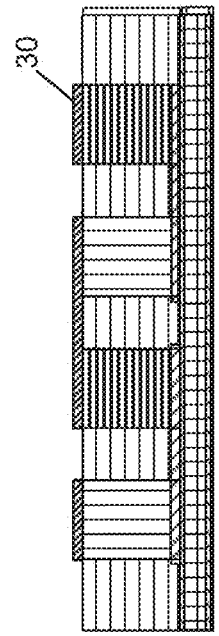
Figure 9C:
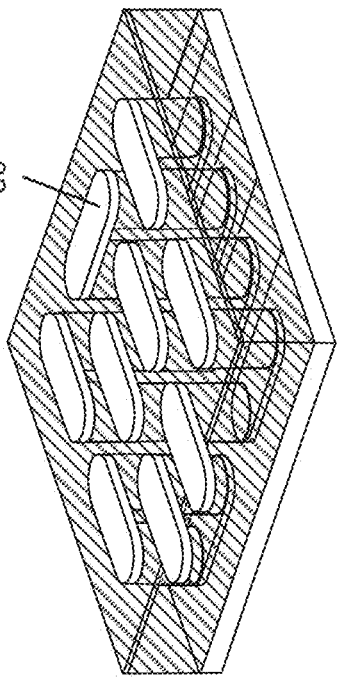

FIG. 9A depicts a layer of Ni deposited by DC electroplating as top interconnectors 30. In various embodiments, the Ni layer is deposited in a thickness between 1 µm and 5 µm, typically about 3 µm. FIGS. 9B and 9C depict the TEG with the top interconnectors 30 and the temporary mold 33 having been removed by acetone. Next, the Au conducting layer 4 on the sidewalls and backside of the substrate and part of connecting lines are chemically etched away to break external electrical connections among bottom interconnectors. All thermoelectric pillars are electrically connected in series by bottom and top interconnectors.

Figure 10A:
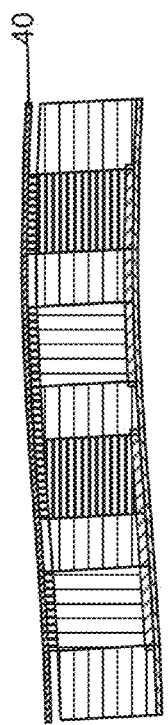
FIGS. 10A and 10B show a side view and a perspective view, respectively, that depict removal of the flexible micro-TEG from the rigid substrate in accordance with some embodiments.
Figure 10B:
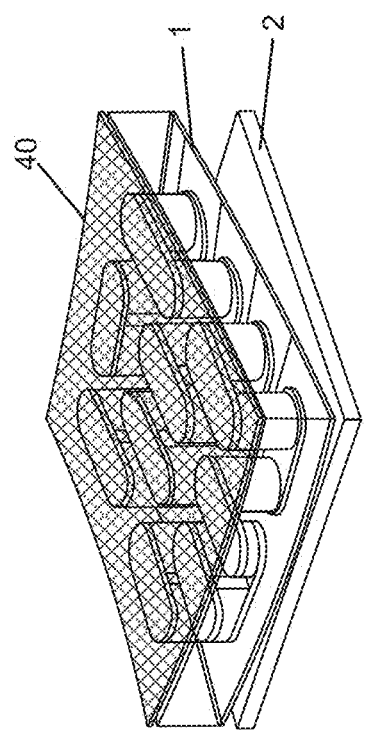

At the end, a flexible layer 40 is applied onto the top surface of the active device layer and the fabricated micro-TEG including the polyimide layer 1 is completely peeled off from the rigid substrate 2, as shown in FIGS. 10A and 10B. Since each of the bottom and top layers of the TEG is flexible, the TEG can conform to a curved surface, as shown previously in FIG. 2(i), while maintaining the improved performance characteristics, particularly low internal resistance and high power density, associated with the cross-plane, electroplated design described herein.

Figure 11:
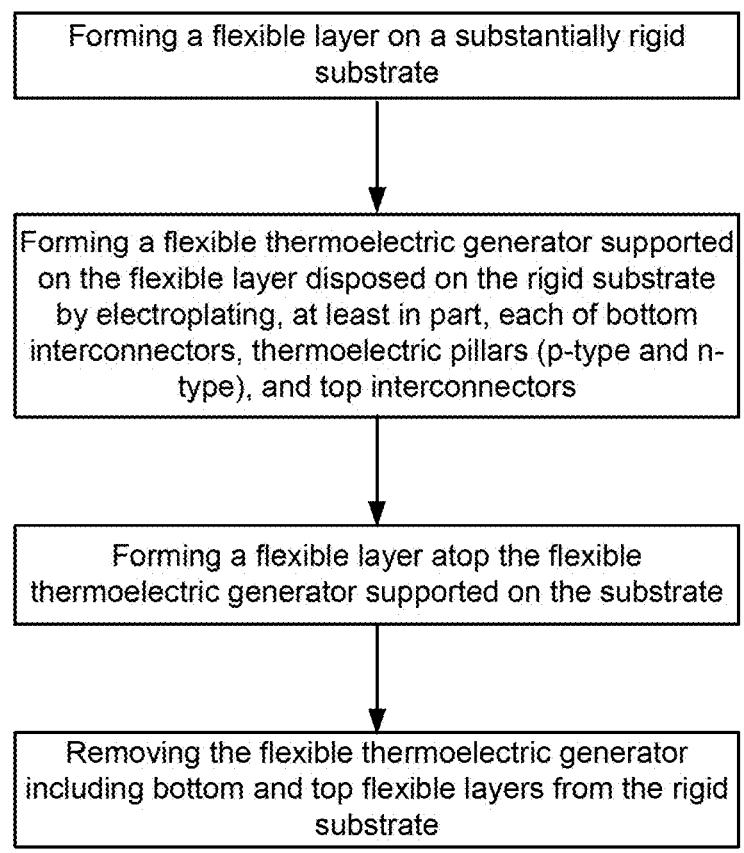
FIGS. 11-12 depict flowcharts of methods of fabricating flexible TEGs in accordance with embodiments of the invention.

FIG. 11 depicts a method of fabricating a flexible micro-TEG in accordance with various embodiments of the invention. The method entails forming a flexible layer on a substantially rigid substrate. Typically, the flexible layer is a polymer, such as polyimide, that is deposited on a silicon substrate, such as by spin coating. Next, the method entails forming a flexible TEG supported on the flexible layer disposed on the rigid substrate by electroplating, at least in part, each of bottom interconnectors, thermoelectric pillars (p-type and n-type materials), and top interconnectors. Another flexible layer is formed on the flexible TEG supported on the substrate, typically another polymer layer, such as polyimide. Lastly, the flexible TEG including bottom and top flexible layers is removed from the rigid substrate.

Figure 12:
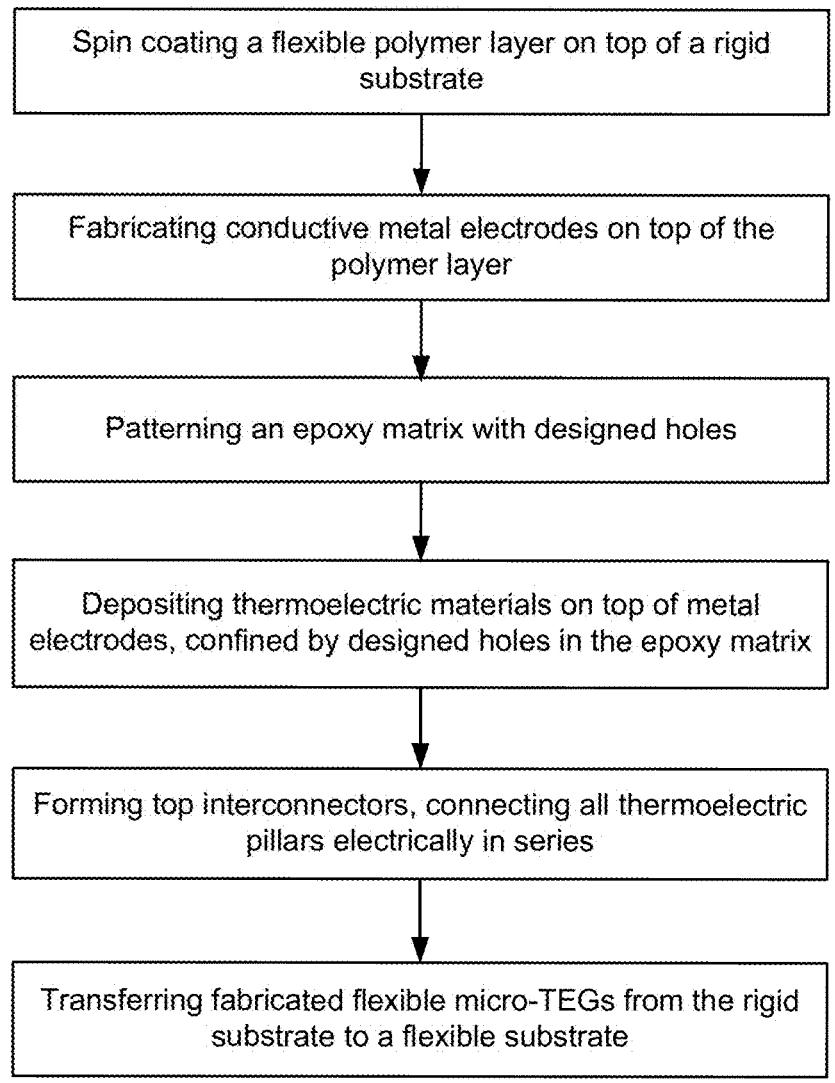

FIG. 12 depicts a method of fabricating a flexible micro-TEG in accordance with various embodiments of the invention. The method entails spin-coating a flexible polymer layer on top of a rigid substrate before fabricating conductive metal electrodes on top of the polymer layer. Next, a mold with designed holes, typically an epoxy matrix, is patterned over the metal electrodes. Thermoelectric materials, such as n-type and p-type materials, are deposited within the holes so as to form thermoelectric pillars of the TEG. Next, top interconnectors are formed, thereby connecting all thermoelectric pillars electrically in series. In various embodiments, each of the bottom and top interconnectors and the thermoelectric pillars are formed, at least in part, by electroplating processes. Lastly, the method entails transferring fabricated flexible micro-TEGs from the rigid substrate to a flexible substrate.

In the examples described herein, the proposed bottom-up approach takes advantage of excellent properties of polyimide including excellent mechanical strength, thermal stability, and chemical stability. The entire fabrication process is conducted on a rigid substrate to ensure high quality and repeatability of the fabricated devices. In the last step, the fabricated micro-TEG is transferred to the flexible layer, which is a particularly important step since the whole device should be peeled off without any damage. The fabrication process described herein is low-cost and can be readily scaled up with commercial production lines. Flexible micro-TEGs fabricated with such method could potentially have a very high output power density due to high density of thermoelectric pillars and very low internal resistance of electroplated components.

Figure 14A:
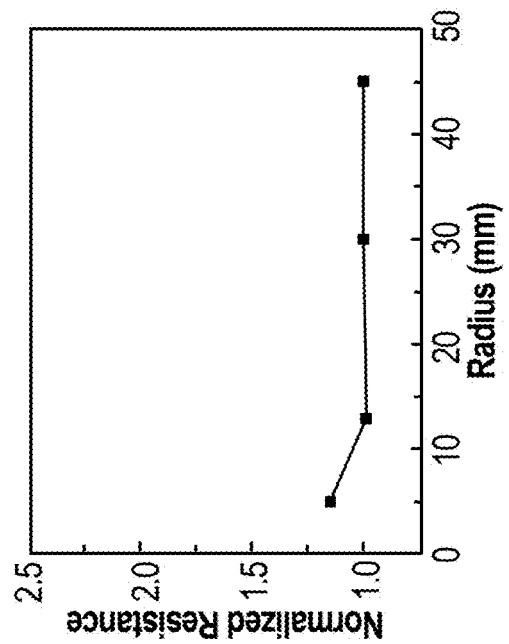
FIG. 14A graphically illustrates the internal resistance of the flexible TEG at different mean temperatures when flat.
Figure 14B:
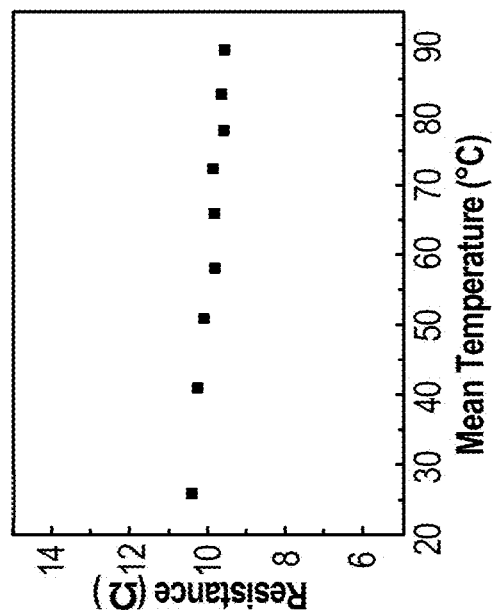
FIG. 14B graphically illustrates normalized internal resistance when the flexible TEG is bended under different curvatures, in accordance with some embodiments.

To demonstrate the advantageous properties of the above described flexible TEGs, prototypes were fabricated and tested. The fabricated flexible micro-TEG consisted of 127 pairs of n-type $Bi_2Te_3$ and p-type $Sb_2Te_3$ thermoelectric pillars, each pillar having a diameter of 200 µm and a thickness of ~10 µm. The effective device area ($A_e$) covered by thermoelectric pillars in the center was about 0.65×0.5 $cm^2$. The flexibility of the TEG was tested by monitoring the electrical resistance of the device when bended repeatedly under differing curvatures. For example, FIG. 13A shows the flexible TEG in a flat condition, FIG. 13B shows the flexible TEG bended along a curvature of 13 mm, and FIG. 13C shows the flexible TEG bended along a curvature of 5 mm. FIG. 14B shows that no obvious resistance change is observed when the TEG is bended under curvatures larger than 13 mm. The resistance is increased by 15% when the bending curvature is further reduced to 5 mm. The resistance was normalized by the value of the flat TEG at room temperature.

Figure 15:
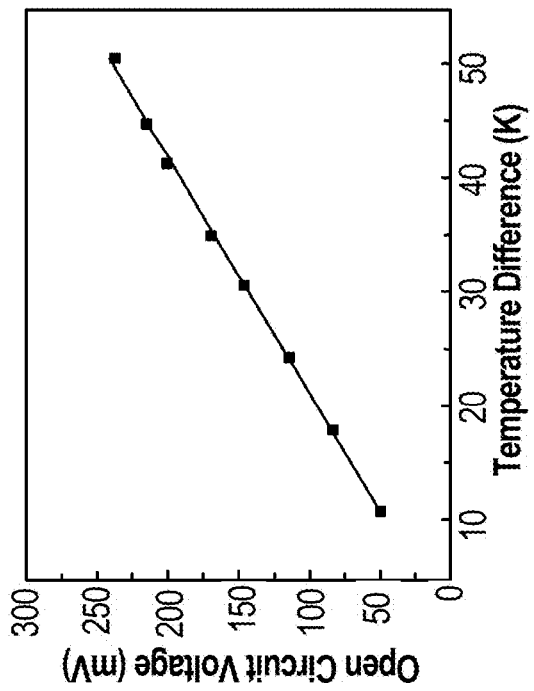
FIG. 15 graphically illustrates measured open-circuit voltage vs. temperature difference in a flexible TEG, in accordance with some embodiments.

A homemade testing setup is used to characterize the performance of the micro-TEG. Two large Au pads on the micro-TEG were electrically connected with external testing equipment by conducting wires. To reduce the contact thermal resistance, a layer of thin thermal grease was applied onto the top surface. A silicon chip with 300 nm silicon dioxide layer was temporarily attached to the top surface of the flexible TEG in order to protect the device during the testing. Two type K thermocouples were tightly bonded with the flexible substrate and top cover, respectively, by thermally conductive paste and used to measure temperatures at hot side ($T_h$) and cold side ($T_c$). The micro-TEG was sandwiched by a designed Cu fixture for testing. The assembled testing setup was heated from the bottom by a hot plate with the PID control. The setup was cooled on the top side by an open-loop water cooling system. Temperatures ($T_h$ and $T_c$) and the generated open-circuit voltage ($V_{oc}$) were recorded by a digital multimeter. Testing was carried out for temperature differences from 11.0 K to 50.7 K. Each data point in FIG. 15, $V_{oc}$ was recorded after the temperature difference across the micro-TEG reached the steady state. The measured $V_{oc}$ demonstrates a linear dependence on temperature difference and the experimental data can be fit by a linear line with high accuracy ($R^2$=0.998). The highest $V_{oc}$ obtained in the measured temperature range was 237 mV at a temperature difference of 50.7 K. The open-circuit voltage per unit temperature difference for the micro-TEG was determined to be 4.8 mV/K.

Figure 16A:
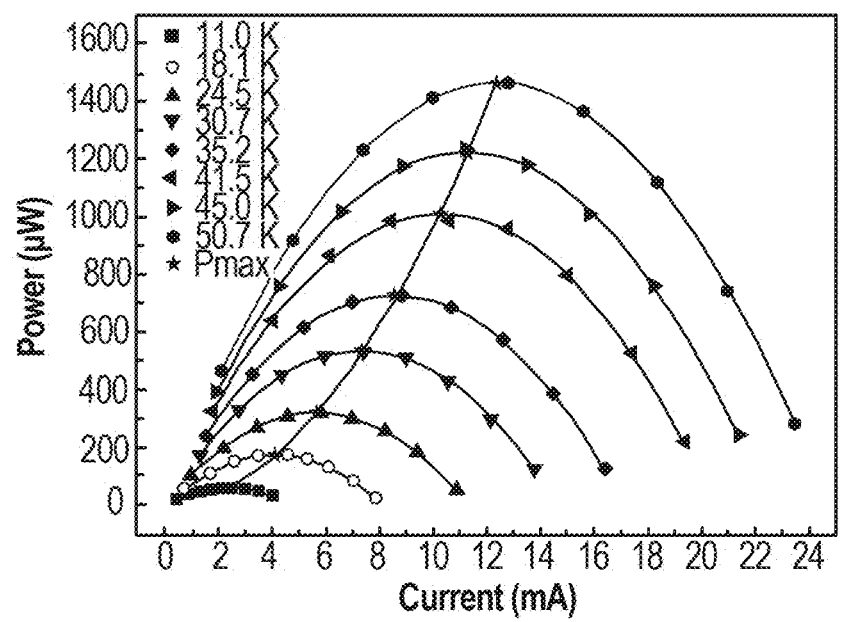
FIG. 16A shows a plot of power vs. current at different temperature differences
Figure 16B:
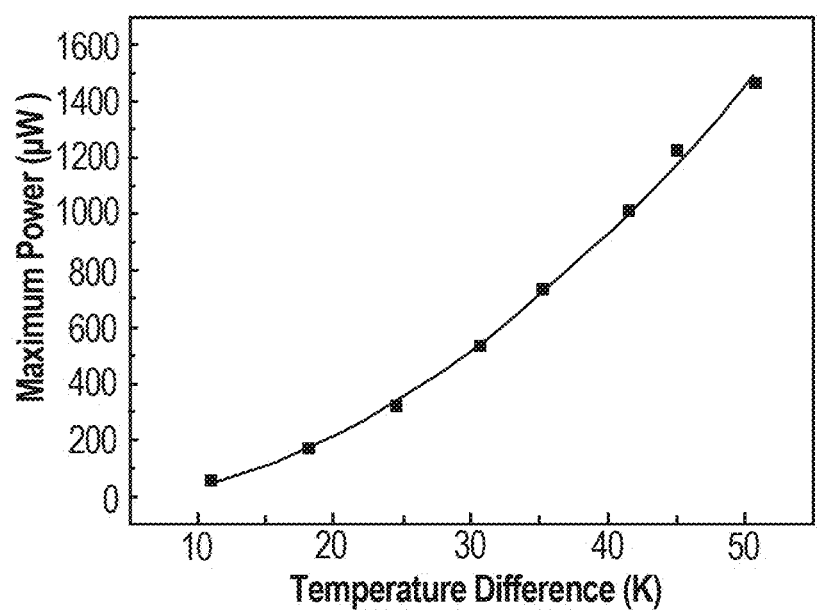
FIG. 16B shows a plot of maximum power vs. temperature difference during operation of a flexible TEG in accordance with some embodiments.

To determine the maximum output power ($P_{max}$), the flexible TEG was connected with a 100Ω potentiometer, which served as the external load. The load voltage (V) and current (I) were measured by a digital multimeter (Agilent, 34401A) and a source meter (Keithley, 2425). At each temperature difference, V and I were recorded when the potentiometer was gradually adjusted from 10Ω to 100Ω. For each load resistance, the power output can be calculated from the recorded V and I. FIG. 16A plots the calculated power as a function of the current for temperature differences ranging from 11 K to 50.7 K. The maximum power is denoted by stars and the solid line represents the polynomial fitting curve at each temperature difference. $P_{max}$ and the corresponding current ($I_m$) are determined and plotted as stars and the polynomial fitting curve is shown as the starred line. FIG. 16B shows $P_{max}$ at different temperature differences. A maximum power of 1463 µW was obtained at a temperature difference of 50.7 K, corresponding to a power per unit area of 4.5 mW cm$^{-2}$.

Figure 17A:
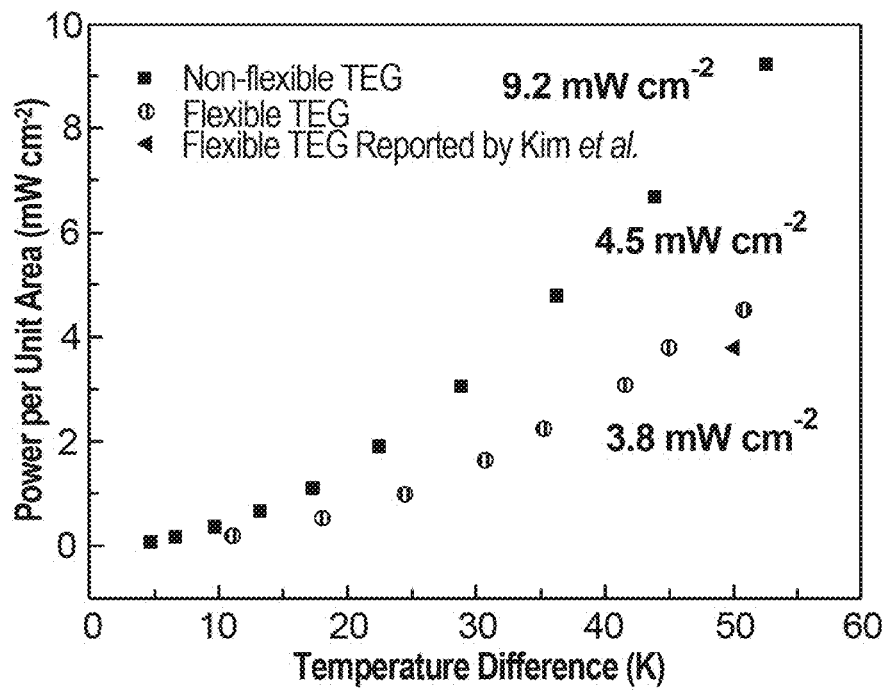
FIG. 17A shows power per unit area for flexible TEGs as compared to non-flexible TEGs and FIG. 17B shows power per unit weight for flexible TEGs as compared to non-flexible TEGs, in accordance with some embodiments.
Figure 17B:
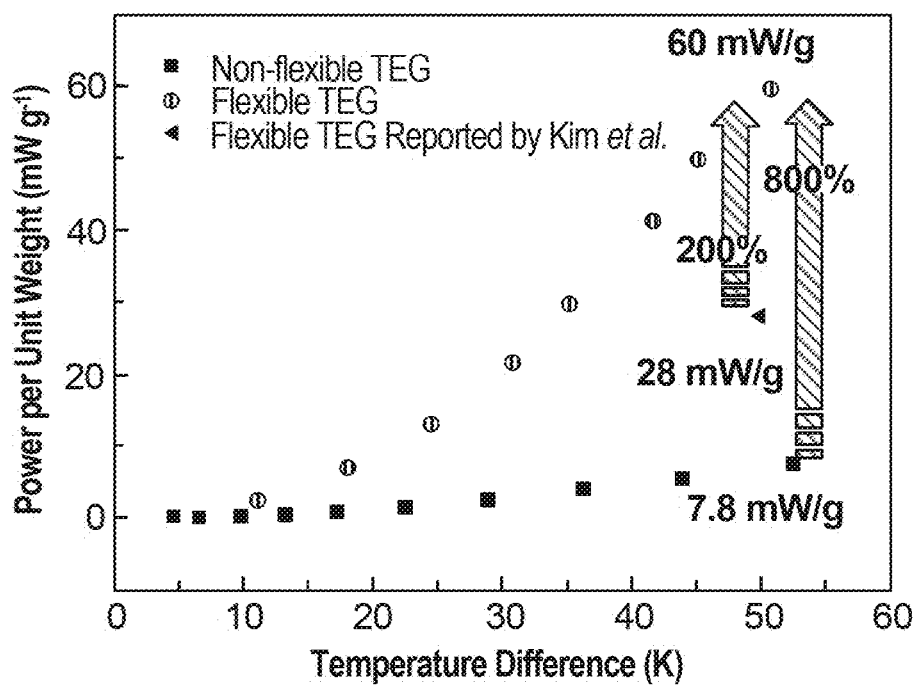

In addition to $V_{oc}$ and $P_{max}$, other key performance indicators for TEGs are power per unit area and power per unit weight. Non-flexible TEGs fabricated under the same conditions achieved a power per unit area of 9.2 mW cm$^{-2}$ at a temperature difference of 52.5 K, which was twice that of the flexible TEG, as seen in FIG. 17A. The lower power per unit area of the flexible TEG can be attributed to the large thermal resistance of the polyimide substrate as compared to the silicon substrate for the non-flexible TEG. The cross-plane thermal conductivity of polyimide was approximately 0.3 W m$^{-1}$ K$^{-1}$, which is much lower than that of silicon, ~149 W m$^{-1}$ K$^{-1}$. Under the same temperature difference, the real temperature drop across the thermoelectric pillars is smaller for the flexible TEG, which results in lower power per unit area. The power per unit weight of the flexible TEG was determined to be 60 mW g$^{-1}$ at a temperature difference of ~50 K, which is eight times that of the non-flexible TEG (7.5 mW g$^{-1}$) as seen in FIG. 17B. Such an extremely light flexible TEG with high power per unit area has substantial advantages, particularly in wearable applications.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. Any references cited herein are incorporated herein by reference in their entirety for all purposes.

While certain dimensions are detailed in the examples described herein, it is understood that various other dimensions can be used so as to fabricate flexible-TEGs of various other dimensions as desired. Variations and modification made by those skilled in the art according to the disclosure herein are considered within the scope of the present invention.

What is claimed is:

1. A method of fabricating a flexible micro-thermoelectric generator (TEG), the method comprising:
   forming a first flexible polymer layer supported on a substantially rigid substrate;
   forming a flexible TEG by electroplating, at least in part, by:
      forming a plurality of conductive metal electrodes on the polymer layer supported on the substrate so as to define a plurality of bottom interconnectors;
      patterning a mold over the plurality of conductive metal electrodes, the mold having a plurality of designed holes corresponding to a plurality of thermoelectric pillars of the TEG that include a plurality of p-type and n-type thermoelectric pillars;
      depositing thermoelectric materials on top of the plurality of metal electrodes confined by the plurality of designed holes in the mold;
      forming a plurality of conductive metal electrodes over the mold so as to define top interconnectors connecting all thermoelectric pillars of the plurality electrically in series; and
   removing the flexible TEG from the substantially rigid substrate.

2. The method of claim 1, further comprising:
   transferring the flexible TEG from the rigid substrate to a flexible substrate.

3. The method of claim 2, wherein transferring the flexible TEG from the rigid substrate to a flexible substrate comprises:
   forming a second flexible polymer layer atop the plurality of top interconnectors; and
   peeling away the TEG, including the first and second flexible polymer layers, from the substantially rigid substrate.

4. The method of claim 1, wherein forming the first flexible polymer layer comprises spin coating the flexible polymer layer on top of the substantially rigid substrate.

5. The method of claim 4, wherein the flexible polymer layer comprises a polyimide layer.

6. The method of claim 4, wherein the substantially rigid substrate comprises a silicon substrate with a silicon dioxide layer.

7. The method of claim 1, further comprising: coating the substrate having the flexible polymer layer with a conductive coating that coats both opposing major faces and sidewalls of the substrate to facilitate electroplating.

8. The method of claim 1, wherein each of the plurality of bottom interconnectors, the plurality of thermoelectric pillars and the plurality of top interconnectors is formed, at least in part, by electroplating.

9. The method of claim 1, wherein the bottom interconnectors are patterned by sputtering and wet etching and defined by a conductive layer thickened by electroplating.

10. The method of claim 1, wherein forming the mold comprises patterning an epoxy matrix.

11. The method of claim 1, wherein depositing thermoelectric materials comprises:
depositing and patterning a first layer of photoresist to cover a first group of the plurality of designed holes of the mold; and
depositing an n-type material in any remaining open holes by pulse electroplating.

12. The method of claim 11, wherein depositing thermoelectric materials further comprises:
depositing and patterning a second layer of photoresist to cover a second group of the plurality of designed holes of the mold that include n-type material deposited therein; and
depositing a p-type material in any remaining open holes by pulse electroplating.

13. The method of claim 1, wherein the thermoelectric materials are deposited by pulse electroplating.

14. The method of claim 1, wherein the first flexible polymer layer is coated directly on the rigid substrate.

15. The method of claim 1, wherein the plurality of top interconnectors are formed over the mold by:
forming a first layer of photoresist with a pattern of shaped holes;
sputtering a conductive layer atop the first layer of photoresist;
forming a second layer of photoresist with the same pattern of shaped holes aligned with the pattern of the first layer of photoresist; and
forming the top interconnectors by depositing a conductive layer by DC electroplating.

16. A method of fabricating a flexible thermoelectric generator (TEG), the method comprising:
forming a flexible layer on a rigid substrate;
forming a flexible TEG on the flexible layer supported on the rigid substrate, wherein the flexible TEG is formed by electroplating, at least in part, each of a plurality of bottom interconnectors, a plurality of p-type and n-type thermoelectric pillars, and a plurality of top interconnectors; and
removing the flexible TEG including the flexible layer supporting the flexible TEG from the rigid substrate.

17. The method of claim 16, further comprising:
forming a flexible layer on the rigid substrate before forming the flexible TEG.

18. The method of claim 17, wherein forming the flexible layer comprises forming a polyimide layer on the rigid substrate.

19. The method of claim 16, wherein removing the flexible TEG from the rigid substrate comprises peeling the flexible layer from the rigid substrate while the flexible TEG remains supported by the flexible layer.

20. The method of claim 19, further comprising:
forming another flexible layer atop the flexible TEG before removing the flexible TEG from the rigid substrate.

21. The method of claim 16, wherein the flexible layer is formed directly on the rigid substrate.

22. A bottom-up method for fabricating flexible micro-thermoelectric generators (TEGs) on a rigid substrate, the method comprising:
spin coating a flexible polymer layer on top of a rigid substrate;
forming, by electroplating at least in part, a flexible TEG on the flexible polymer layer by:
fabricating a plurality of conductive metal electrodes atop the polymer layer;
patterning an epoxy matrix with designated holes;
depositing thermoelectric material atop the plurality of metal electrodes, the thermoelectric material being confined by a plurality of designed holes defined within the epoxy matrix so as to form a plurality of thermoelectric pillars; and
forming a plurality of top interconnectors connecting the plurality of thermoelectric pillars electrically in series; and
removing the flexible TEG including the flexible layer supporting the flexible TEG from the rigid substrate.

* * * * *